United States Patent
Takahashi et al.

(10) Patent No.: US 8,654,557 B2
(45) Date of Patent: Feb. 18, 2014

(54) SEMICONDUCTOR MEMORY DEVICE, INFORMATION PROCESSING SYSTEM INCLUDING THE SAME, AND CONTROLLER

(76) Inventors: Yasushi Takahashi, Tokyo (JP); Toru Ishikawa, Tokyo (JP)

( * ) Notice: Subject to any disclaimer, the term of this patent is extended or adjusted under 35 U.S.C. 154(b) by 0 days.

(21) Appl. No.: 13/593,046

(22) Filed: Aug. 23, 2012

(65) Prior Publication Data

US 2012/0320686 A1 Dec. 20, 2012

Related U.S. Application Data

(63) Continuation of application No. 12/784,147, filed on May 20, 2010, now Pat. No. 8,274,844.

(30) Foreign Application Priority Data

May 26, 2009 (JP) .................................. 2009-126827

(51) Int. Cl.
*G11C 5/06* (2006.01)

(52) U.S. Cl.
USPC ......... 365/63; 365/189.12; 365/222; 365/240

(58) Field of Classification Search
USPC ................................ 365/63, 189.12, 222, 240
See application file for complete search history.

(56) References Cited

U.S. PATENT DOCUMENTS

| 5,025,415 A | 6/1991 | Masuyama et al. |
| 6,191,997 B1 | 2/2001 | Son et al. |
| 6,304,492 B2 | 10/2001 | Watanabe |
| 6,324,118 B1 | 11/2001 | Ooishi |
| 6,834,014 B2 * | 12/2004 | Yoo et al. ................. 365/230.06 |
| 7,272,057 B2 * | 9/2007 | Sato ............................. 365/200 |
| 7,624,225 B2 | 11/2009 | Gower et al. |
| 7,804,720 B2 | 9/2010 | Lee et al. |

FOREIGN PATENT DOCUMENTS

JP 11-66841 3/1999

OTHER PUBLICATIONS

Takahashi et al., U.S. Office Action mailed Apr. 25, 2013, directed to U.S. Appl. No. 13/593,018; 6 pages.
Takahashi, et al., Office Action mailed Feb. 13, 2012, directed to U.S. Appl. No. 12/784,147; 15 pages.

* cited by examiner

*Primary Examiner* — Son Dinh

(57) ABSTRACT

A system including a controller and a memory chip. The controller includes first and second selection signal terminals supplying first and second selection signals, respectively, multiple first data terminals and multiple second data terminals. The memory chip includes a semiconductor substrate, third and fourth selection signal terminals provided on the semiconductor substrate and electrically coupled to the first and second selection signal terminals of the controller, respectively. Multiple third data terminals are provided on the semiconductor substrate and electrically coupled to the first data terminals of the controller, respectively. Multiple fourth data terminals are provided on the semiconductor substrate and electrically coupled to the second data terminals of the controller, respectively. The first and third data terminals communicate first data in response to the first selection signal. The second and fourth data terminals communicate second data in response to the second selection signal.

20 Claims, 10 Drawing Sheets

SEMICONDUCTOR MEMORY DEVICE, INFORMATION PROCESSING SYSTEM INCLUDING THE SAME, AND CONTROLLER

REFERENCE TO RELATED APPLICATIONS

This application is a continuation of U.S. patent application Ser. No. 12/784,147, filed May 20, 2010, now U.S. Pat. No. 8,274,844 which claims the priority of Japanese Patent Application No. 2009-126827, filed May 26, 2009, the contents of which prior applications are incorporated herein by reference.

BACKGROUND OF THE INVENTION

1. Field of the Invention

The present invention relates to a semiconductor memory device and an information processing system including the same, and more particularly relates to a semiconductor memory device having a plurality of memory circuit units operable independently of each other and an information processing system including the semiconductor memory device. The present invention also relates to a controller that controls the semiconductor memory device.

2. Description of Related Art

Many DRAMs (Dynamic Random Access Memories) as representative semiconductor memory devices have their internal portions divided into plural banks in order to enable parallel operations (see Japanese Patent Application Laid-open No. H11-66841). A controller connected to the DRAMs can individually issue a command to each bank, and when a certain bank is performing a read operation or a write operation, the controller can issue commands to another bank. As a result, banks can perform parallel operations, thereby increasing utilization efficiency of a data bus connected between the DRAMs and the controller.

However, because these bank share a data input/output terminal, read data cannot be output from another bank during a period when read data is being output from a certain bank. Therefore, even when a part of bits of read data output from a certain bank is unnecessary for the controller, read data cannot be output from another bank until when a series of burst output are finished.

In a so-called multibit product, a part of bits of read data is not necessary in many cases. For example, when a DRAM has 32 bits for I/O (input and output) data, a controller requires only 16-bit data in many cases. In this case, the rest of 16 bits are invalidated by the controller. Frequent occurrence of such situations lowers utilization efficiency of a data bus, resulting in a problem that an effective data transfer rate is decreased.

FIG. 9 is a timing chart for explaining this problem.

FIG. 9 is an example of an operation of a DDR synchronous DRAM in which I/O data has 32 bits (DQ0 to DQ31), a burst length is 4 (BL=4), and a CAS latency is (CL=5). Meshed data is necessary data, and unmeshed data is unnecessary data. In this example, because the BL is 4, read commands (A, B, C, and D) can be input at every two clock cycles.

At one-time access, 128-bit (=32×4) data is output from such a DRAM. In the example shown in FIG. 9, either 64-bit data output from DQ0 to DQ15 or 64-bit data output from DQ16 to DQ31 is necessary data, and rest of the data is not necessary. In this case, because only a half of the output data is necessary, the effective data transfer rate decreases to a half.

While a problem in the read operation has been explained with reference to FIG. 9, this problem also occurs in a write operation.

As described above, according to a conventional semiconductor memory device, when a part of read data or write data is unnecessary data, its effective data transfer rate decreases. This kind of problem occurs noticeably in multibit products having a large number of I/O bits.

SUMMARY

In one embodiment there is provided a system that includes a controller and a memory chip. The controller includes first and second selection signal terminals supplying first and second selection signals, respectively; a plurality of first data terminals; and a plurality of second data terminals. The memory chip includes a semiconductor substrate; third and fourth selection signal terminals provided on the semiconductor substrate and being electrically coupled to the first and second selection signal terminals of the controller, respectively. A plurality of third data terminals are provided on the semiconductor substrate and electrically coupled to the first data terminals of the controller, respectively. A plurality of fourth data terminals are provided on the semiconductor substrate and electrically coupled to the second data terminals of the controller, respectively. The first and third data terminals communicate first data in response to the first selection signal. The second and fourth data terminals communicate second data in response to the second selection signal.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

Figure 1:
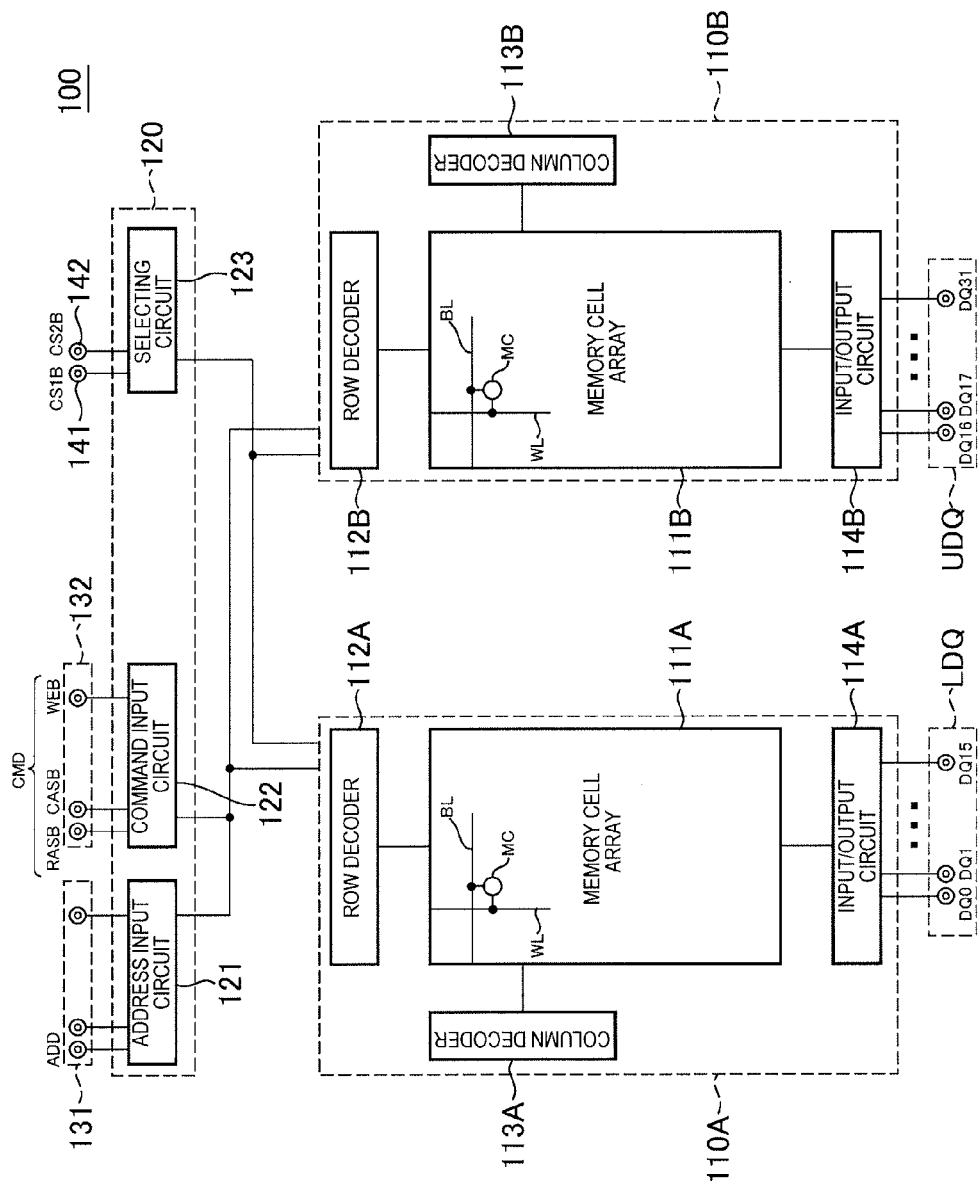
FIG. 1 is a schematic block diagram showing a configuration of a semiconductor memory device 100 according to a first embodiment of the present invention.

FIG. 1 is a schematic block diagram showing a configuration of a semiconductor memory device 100 according to a first embodiment of the present invention. A DDR synchronous DRAM is assumed as the semiconductor memory device 100 according to the first embodiment.

As shown in FIG. 1, the semiconductor memory device 100 according to the first embodiment includes two memory circuit units 110A and 110B, and a common circuit 120 allocated in common to these memory circuit units 110A and 110B. The memory circuit units 110A and 110B are circuit blocks capable of mutually independently performing a read operation and a write operation. A data input/output terminal group LDQ is allocated to the memory circuit unit 110A, and a data input/output terminal group UDQ is allocated to the memory circuit unit 110B. The data input/output terminal group LDQ includes 16 data input/output terminals DQ0 to DQ15. The data input/output terminal group UDQ includes 16 data input/output terminals DQ16 to DQ31.

In this way, the semiconductor memory device 100 according to the first embodiment is a single memory (a memory integrated on a single semiconductor substrate) having 32 bits (DQ0 to DQ31) for I/O. A half of the data input/output terminals (DQ0 to DQ15) are allocated to the memory circuit unit 110A, and the rest half of the data input/output terminals (DQ16 to DQ31) are allocated to the memory circuit unit 110B. Therefore, from a controller, it looks as if two memory chips are present. In this respect, the semiconductor memory device 100 is clearly distinguished from a semiconductor memory device which is simply divided into plural banks.

On the other hand, an address terminal group 131 and a command terminal group 132 are common to the memory circuit units 110A and 110B. An address signal ADD and a command signal CMD supplied via these terminals are input to the common circuit 120. Therefore, from the controller, although it looks as if two memory chips are present, completely independent two memories are not actually integrated in one chip. Consequently, the memory chip is not different from a conventional memory chip having 32 bits for I/O, except that the number of terminals is different in that a chip-selection-signal input terminal described later is added. On the other hand, when completely independent two memories are simply integrated into one chip, this substantially increases the number of terminals to almost twice. Therefore, in this respect, the present invention is clearly distinguished from a simple integration of two completely independent memories into one chip.

As shown in FIG. 1, the common circuit 120 has an address input circuit 121 to which the address signal ADD is input, and a command input circuit 122 to which the command signal CMD is input. The command signal CMD is expressed by a combination of a row-address strobe signal RASB, a column-address strobe signal CASB, and a write enable signal WEB and so on. The address signal ADD and the command signal CMD input to these input circuits 121 and 122 are supplied to either one or both of the memory circuit units 110A and 110B. A selecting circuit 123 contained in the common circuit 120 selects a memory circuit unit.

Chip selection signals CS1B and CS2B are input to the selecting circuit 123 via chip-selection-signal input terminals 141 and 142, respectively. The chip selection signal CS1B is a signal to select the memory circuit unit 110A. When the chip selection signal CS1B is activated at a low level, the address signal ADD and the command signal CMD input to the input circuits 121 and 122 are supplied to the memory circuit unit 110A. On the other hand, the chip selection signal CS2B is a signal to select the memory circuit unit 110B. When the chip selection signal CS2B is activated at a low level, the address signal ADD and the command signal CMD input to the input circuits 121 and 122 are supplied to the memory circuit unit 110B. Therefore, when both of the chip selection signals CS1B and CS2B are active, the address signal ADD and the command signal CMD are supplied to both of the memory circuit units 110A and 110B. The memory circuit unit 110A has a memory cell array 111A including plural word lines WL, plural bit lines BL, and plural memory cells MC arranged at intersections between these lines. A row decoder 112A selects the word line WL included in the memory cell array 111A. A column decoder 113A selects the bit line BL included in the memory cell array 111A. The row decoder 112A selects the word line WL based on the address signal ADD supplied when the command signal CMD indicates an active command. On the other hand, the column decoder 113A selects the bit line BL based on the address signal ADD supplied when the command signal CMD indicates a column command (a read command or a write command).

The memory cells MC selected by the row decoder 112A and the column decoder 113A are connected to an input/output circuit 114A. With this connection, when the command signal CMD indicates a read operation, read data read from the memory cell array 111A is output from the data input/output terminal group LDQ (DQ0 to DQ15) via the input/output circuit 114A. When the command signal CMD indicates a write operation, write data input from the data input/output terminal group LDQ (DQ0 to DQ15) are written into the memory cell array 111A via the input/output circuit 114A.

A circuit configuration and an operation of the memory circuit unit 110B are similar to the circuit configuration and the operation of the memory circuit unit 110A, and thus redundant explanations thereof will be omitted.

When the chip selection signal CS1B is activated based on the above configuration, the memory circuit unit 110A performs a read operation or a write operation via the data input/output terminal group LDQ (DQ0 to DQ15) based on the address signal ADD input via the address terminal 131, regardless of an operation of the memory circuit unit 110B. Similarly, when the chip selection signal CS2B is activated, the memory circuit unit 110B performs a read operation or a write operation via the data input/output terminal group UDQ (DQ16 to DQ31) based on the address signal ADD input via the address terminal 131, regardless of an operation of the memory circuit unit 110A.

As explained above, while the conventional semiconductor memory device having 32 bits for I/O needs to input and output data in 32 bits, the semiconductor memory device 100 according to the first embodiment can input and output data in 16 bits. Therefore, unnecessary read data or unnecessary write data is not required to be transferred, and thus utilization efficiency of a data bus can be increased.

Figure 2:
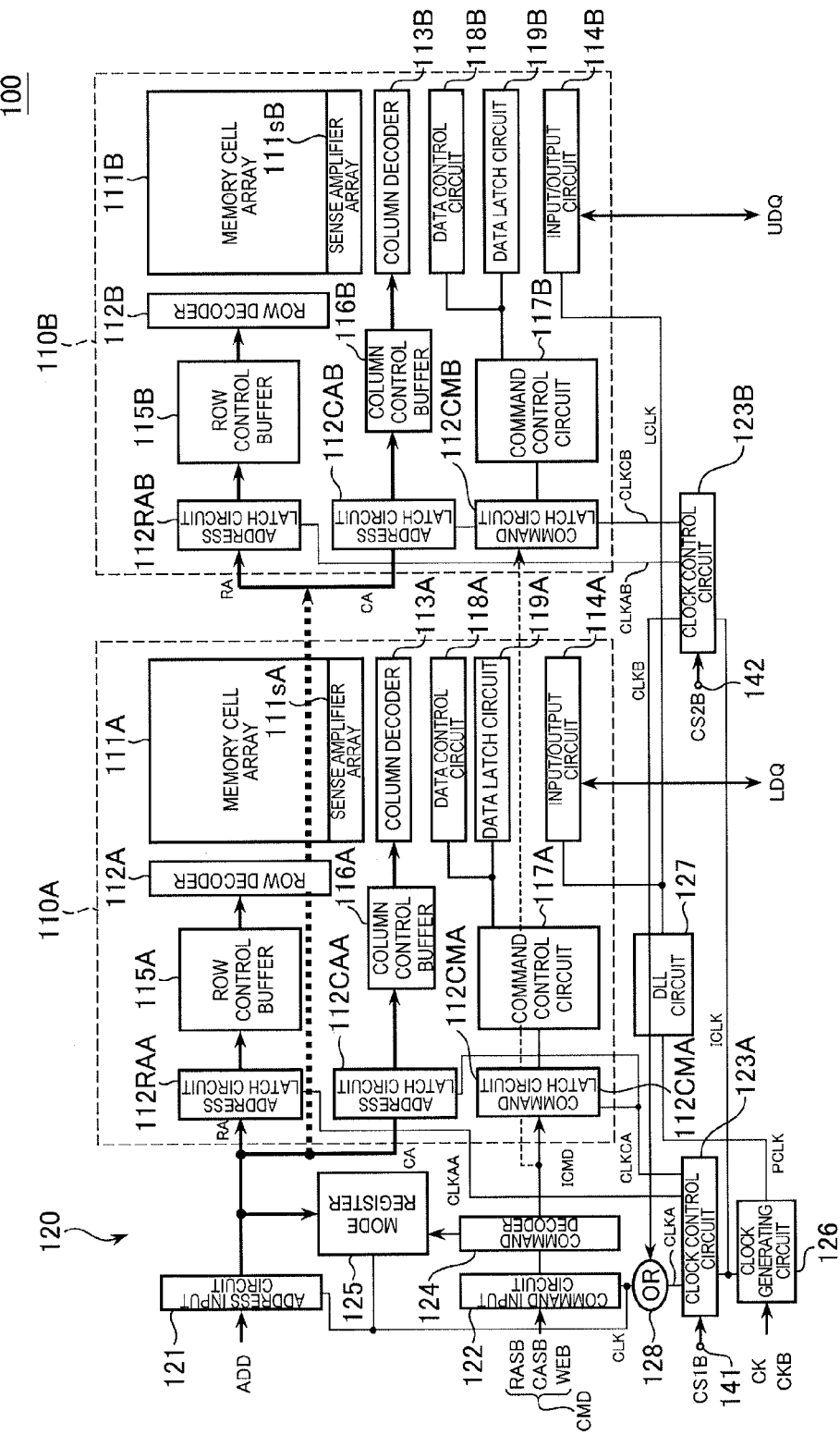
FIG. 2 is a block diagram showing a detailed configuration of the semiconductor memory device 100 according to the first embodiment.

FIG. 2 is a block diagram showing a detailed configuration of the semiconductor memory device 100 according to the first embodiment.

As shown in FIG. 2, the common circuit 120 of the semiconductor memory device 100 according to the first embodiment further includes a command decoder 124, a mode register 125, a clock generating circuit 126, and a DLL (Delay Lock Loop) circuit 127. The selecting circuit 123 shown in FIG. 1 is divided into a clock control circuit 123A allocated to the memory circuit unit 110A, and a clock control circuit 123B allocated to the memory circuit unit 110B.

The command decoder 124 generates an internal command ICMD by decoding the command CMD input via the command input circuit 122. The generated internal command ICMD is supplied to the memory circuit units 110A and 110B, as well as to the mode register 125. The mode register 125 sets an operation mode of the semiconductor memory device 100. In the first embodiment, operation modes of the memory circuit units 110A and 110B are set common by the mode register 125. A CAS latency (CL) and a burst length (BL) are mentioned as operation modes set to the mode register 125. A set value of the mode register 125 is updated based on the address signal ADD when the command signal CMD indicates "mode register set".

The clock generating circuit 126 generates internal clocks ICLK and PCLK by receiving external clock signals CK and CKB supplied from outside. Among these clocks, the internal clock ICLK is supplied to the clock control circuits 123A and 123B. The clock control circuit 123A generates latch clocks CLKA, CLKAA, and CLKCA when the chip selection signal CS1B is active. The latch clock CLKAA is an operation clock of an address latch circuit 112RAA included in the memory circuit unit 110A, and the latch clock CLKCA is an operation clock of an address latch circuit 112CAA and a command latch circuit 112CMA. With this arrangement, latch operations of the address latch circuits 112RAA and 112CAA and the command latch circuit 112CMA included in the memory circuit unit 110A are permitted only when the chip selection signal CS1B is active.

The address signal ADD latched by the address latch circuits 112RAA and 112CAA can be a signal not decoded at all or can be a partly decoded predecoded signal.

Similarly, the clock control circuit 123B generates latch clocks CLKB, CLKAB, and CLKCB when the chip selection signal CS2B is active. With this arrangement, latch operations of the address latch circuits 112RAB and 112CAB and the command latch circuit 112CMB included in the memory circuit unit 110B are permitted only when the chip selection signal CS2B is active.

An OR circuit 128 logically adds the latch clocks CLKA and CLKB generated by the clock control circuits 123A and 123B, and supplies a latch clock CLK as a result of this OR operation, to the address input circuit 121 and the command input circuit 122. With this arrangement, latch operations by the address input circuit 121 and the command input circuit 122 are permitted when at least one of the chip selection signals CS1B and CS2B is active.

On the other hand, the internal clock PCLK is supplied to the DLL circuit 127. The DLL circuit 127 generates an internal clock LCLK which is phase-controlled to the external clocks CK and CKB. The generated internal clock LCLK is supplied in common to the input/output circuits 114A and 114B included in the memory circuit units 110A and 110B. The internal clock LCLK is a signal to control an output timing of read data. With this arrangement, the DLL circuit 127 controls an output timing of read data via the data input/output terminal groups LDQ and UDQ allocated to the memory circuit units 110A and 110B.

The memory circuit units 110A and 110B are explained next.

As described above, the memory circuit unit 110A includes the address latch circuits 112RAA and 112CAA, and the command latch circuit 112CMA. The address latch circuit 112RAA latches a row address RA out of the address signal ADD input via the address input circuit 121. The address latch circuit 112RAA performs a latch operation based on the latch clock CLKAA. The address latch circuit 112CAA latches a column address CA out of the address signal ADD input via the address input circuit 121. The address latch circuit 112CAA performs a latch operation based on the latch clock CLKCA. Further, the command latch circuit 112CMA latches the internal command ICMD as output of the command decoder 124. The command latch circuit 112CMA performs a latch operation based on the latch clock CLKCA.

The row address RA latched by the address latch circuit 112RAA is supplied to the row decoder 112A via a row control buffer 115A, thereby selecting the word line WL. A column address CA latched by the address latch circuit 112CAA is supplied to the column decoder 113A via a column control buffer 116A, thereby selecting a sense amplifier included in a sense amplifier array 111sA (that is, selecting the bit line BL).

Further, the internal command ICMD latched by the command latch circuit 112CMA is supplied to a command control circuit 117A. The command control circuit 117A controls a data control circuit 118A and a data latch circuit 119A, thereby controlling a transfer timing of read data and write data.

The memory circuit unit 110B has the same circuit configuration as that of the memory circuit unit 110A, except that the latch clocks CLKAB and CLKCB are used instead of the latch clocks CLKAA and CLKCA, and thus redundant explanations thereof will be omitted.

The circuit configuration of the semiconductor memory device 100 according to the first embodiment is as described above. As explained above, the semiconductor memory device 100 according to the first embodiment has a characteristic such that the device has two chip-selection-signal input terminals. Therefore, the controller that controls the semiconductor memory device 100 can handle chips as two memory chips that can be changed by the chip selection signals CS1B and CS2B.

Figure 3A:
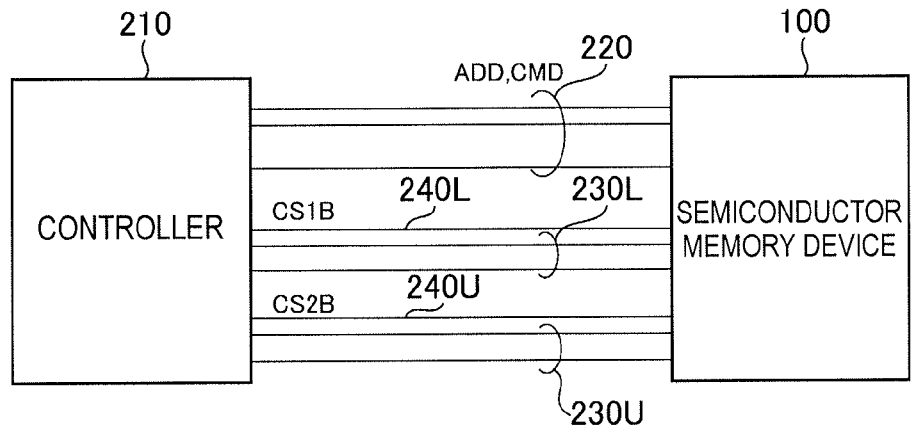
FIG. 3A is a block diagram of an information processing system 200 using the semiconductor memory device 100 according to the first embodiment.

FIG. 3A is a block diagram of an information processing system 200 using the semiconductor memory device 100 according to the first embodiment.

The information processing system 200 shown in FIG. 3A is configured by the semiconductor memory device 100 according to the first embodiment and a controller 210 connected to the semiconductor memory device 100. The controller 210 and the semiconductor memory device 100 are connected to each other by a command/address bus 220, data buses 230L and 230U, and selection buses 240L and 240U.

The command/address bus 220 is a wiring to supply the command signal CMD, the address signal ADD, and the external clocks CK and CKB from the controller 210 to the semiconductor memory device 100.

The data bus 230L is a wiring connected to the data input/output terminal group LDQ (DQ0 to DQ15), and is used to transfer read data or write data of 16 bits between the controller 210 and the semiconductor memory device 100. The data bus 230U is a wiring connected to the data input/output terminal group UDQ (DQ16 to DQ31), and is used to transfer read data or write data of 16 bits between the controller 210 and the semiconductor memory device 100.

The selection bus 240L is a wiring to supply the chip selection signal CS1B from the controller 210 to the semiconductor memory device 100. The selection bus 240U is a wiring to supply the chip selection signal CS2B from the controller 210 to the semiconductor memory device 100.

As explained above, two selection buses are used in the information processing system 200.

Figure 3B:
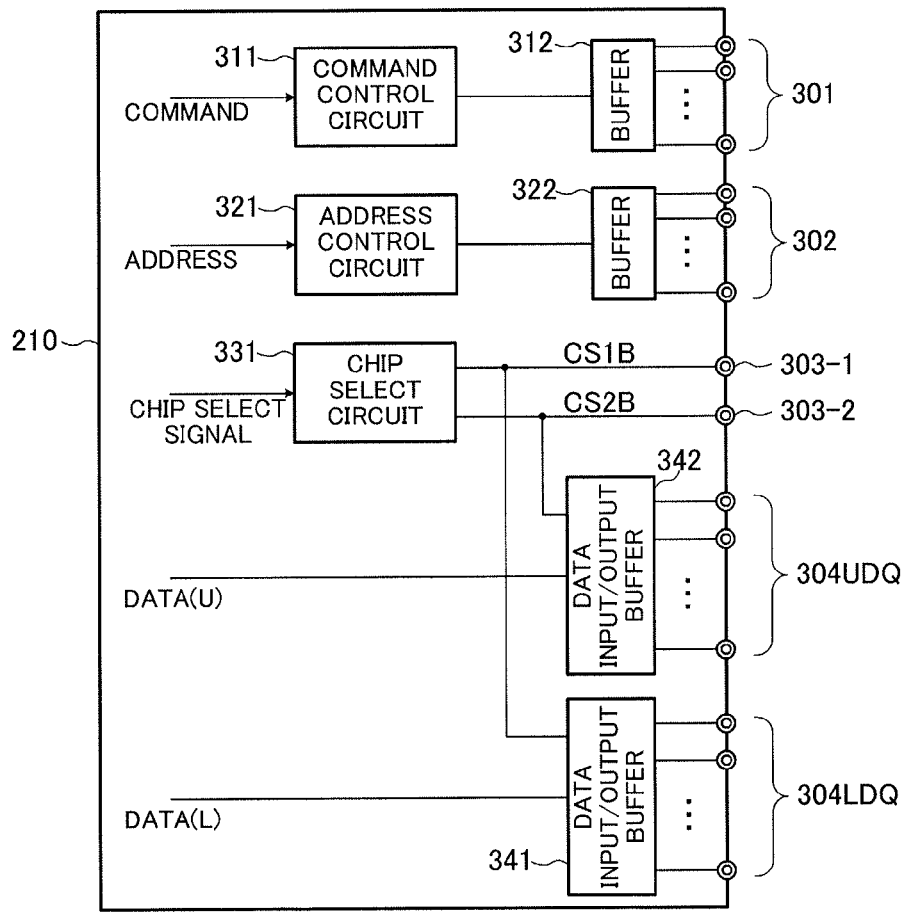
FIG. 3B is a block diagram of a controller 210.

FIG. 3B is a block diagram of the controller 210.

As shown in FIG. 3, the controller 210 includes command terminals 301, address terminals 302, chip select terminals 303-1 and 303-2, and data input/output terminals 304UDQ and 304LDQ. The command terminals 301 are supplied with a command signal via a command control circuit 311 and a buffer circuit 312. The command control circuit 311 outputs the command signal when either the chip select signal CS1B or CS2B is activated. The address terminals 302 are supplied with an address signal via an address control circuit 321 and a buffer circuit 322. The address control circuit 321 outputs the address signal when either the chip select signal CS1B or CS2B is activated.

The chip select signals CS1B and CS2B are supplied from a chip select circuit 331. When the select circuit 331 activates the chip select signal CS1B, the chip select signal CS1B is supplied to the semiconductor memory device 100 via the chip select terminal 303-1. When the select circuit 331 activates the chip select signal CS2B, the chip select signal CS2B is supplied to the semiconductor memory device 100 via the chip select terminal 303-2.

When the select circuit 331 activates the chip select signal CS1B, a data input/output buffer 341 is activated. When the data input/output buffer 341 is activated, the data input/output terminals 304LDQ can receive write data from the data input/output buffer 341 or receive read data from the semiconductor memory device 100.

When the select circuit 331 activates the chip select signal CS2B, a data input/output buffer 342 is activated. When the data input/output buffer 342 is activated, the data input/output terminals 304UDQ can receive write data from the data input/output buffer 341 or receive read data from the semiconductor memory device 100.

Therefore, when the chip select terminal 303-1 receives an activated chip select signal CS1B and the chip select terminal 303-2 receives an inactivated chip select signal CS2B, the data input/output terminals 304LDQ receive read data or write and the input/output terminals 304UDQ do not receive the data. Similarly, when the chip select terminal 303-2 receives an activated chip select signal CS2B and the chip select terminal 303-1 receives an inactivated chip select signal CS1B, the data input/output terminals 304UDQ receive read data or write and the input/output terminals 304LDQ do not receive the data.

As described the above, the data input/output buffers 341 and 342 are controlled based on the chip select signals CS1B and CS2B. The command terminals 301 and the address terminals 302 are provided in common to the first group constituted of the chip select terminal 303-1 and the data input/output terminals 304LDQ and the second group constituted of the chip select terminal 303-2 and the data input/output terminals 304UDQ.

With this configuration, the controller 210 can obtain read data from the semiconductor memory device 100 or write data into the semiconductor memory device 100, by supplying the address signal ADD and the like via the command/address bus 220. The controller 210 can individually access the plural memory circuit units 110A and 110B included in the semiconductor memory device 100, by supplying the plural chip selection signals CS1B and CS2B to one semiconductor memory device 100. Consequently, the controller does not need to perform a process of invalidating unnecessary data.

Figure 4:
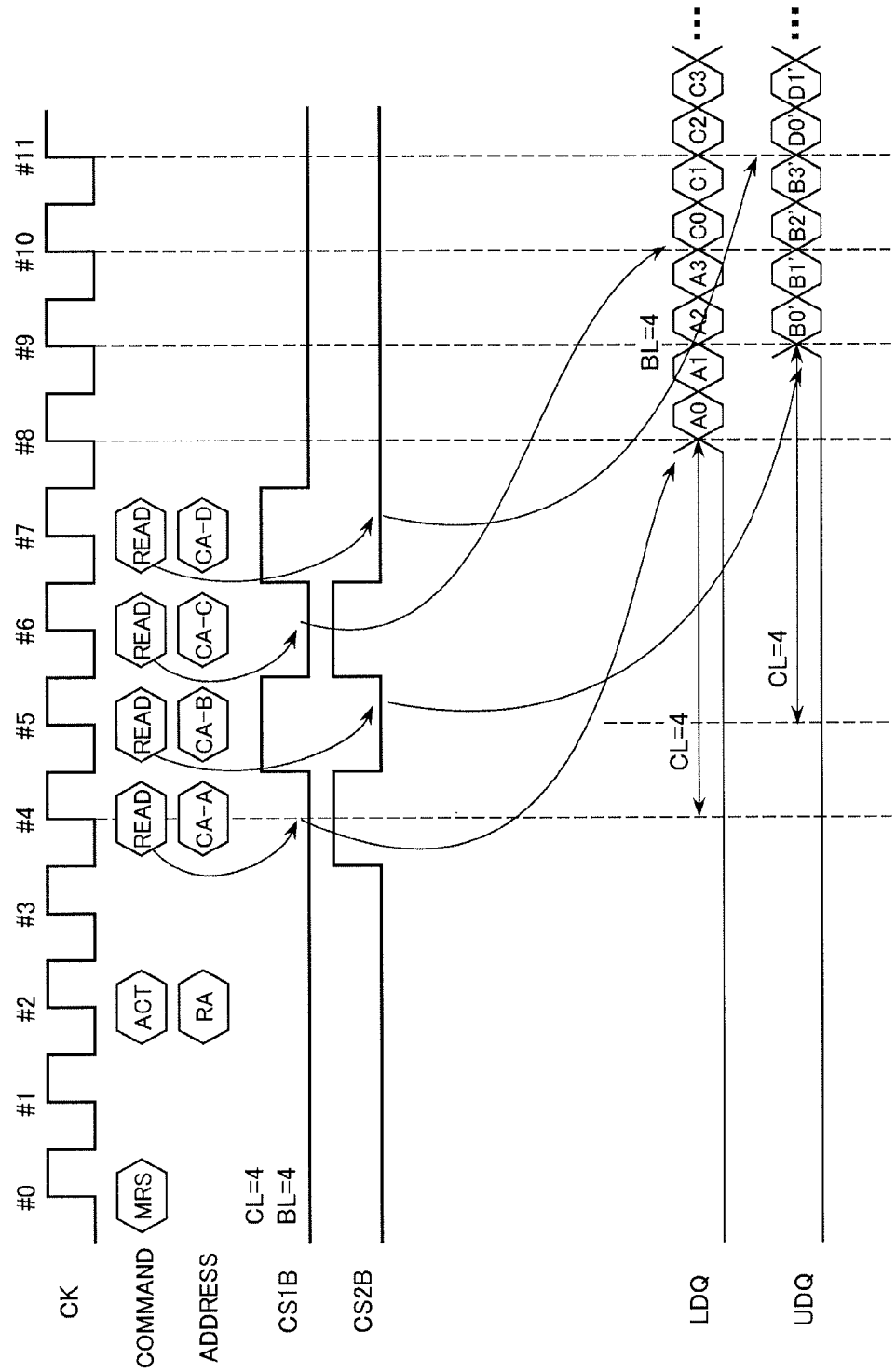
FIG. 4 is a timing diagram for explaining a read operation of the semiconductor memory device 100 according to the first embodiment, and shows a case of alternately accessing the memory circuit units 110A and 110B.

FIG. 4 is a timing diagram for explaining a read operation of the semiconductor memory device 100 according to the first embodiment, and shows a case of alternately accessing the memory circuit units 110A and 110B.

In an example shown in FIG. 4, a mode-register set command MRS is issued synchronously with an active edge #0 of the external clock CK, thereby setting a burst length=4 (BL=4) and CAS latency=4 (CL=4) to the mode register 125. Next, the active command ACT and the row address RA are input synchronously with an active edge #2 of the external clock CK. During this period, both of the chip selection signals CS1B and CS2B are activated at a low level. Therefore, the row address RA is latched by both of the memory circuit units 110A and 110B. In FIG. 4, "no operation (NOP) command" is input during a period when the chip selection signal CS1B or CS2B is at a low level and also when a command is not written. The no operation (NOP) command is not shown in FIG. 4, and also not shown in other timing diagrams.

Next, a read command READ and a column address CA-A are input synchronously with an active edge #4 of the external clock CK in a state that the chip selection signal CS2B is inactivated at a high level. Consequently, the read command READ and the column address CA-A are latched by the memory circuit unit 110A, but are not latched by the memory circuit unit 110B. Therefore, only the memory circuit unit 110A performs a read operation, and starts burst output from an active edge #8 when the CAS latency (CL=4) passes. Because a DDR synchronous DRAM is assumed for the semiconductor memory device 100 according to the first embodiment, one-bit read data is output at each half-clock cycle at a burst output time. Consequently, burst output of four bits started from the active edge #8 is completed at an active edge #10 (A0 to A3).

On the other hand, after the active edge #4 of the external clock CK passes, the read command READ and a column address CA-B are input synchronously with an active edge #5 of the external clock CK in a state that the chip selection signal CS1B is inactivated at a high level. Consequently, the read command READ and the column address CA-B are latched by the memory circuit unit 110B, but are not latched by the memory circuit unit 110A. Therefore, only the memory circuit unit 110B performs a read operation, and starts burst output from an active edge #9 when the CAS latency (CL=4) passes. Burst output of four bits started from the active edge #9 is completed at an active edge #11 (B0' to B3').

Figure 9:
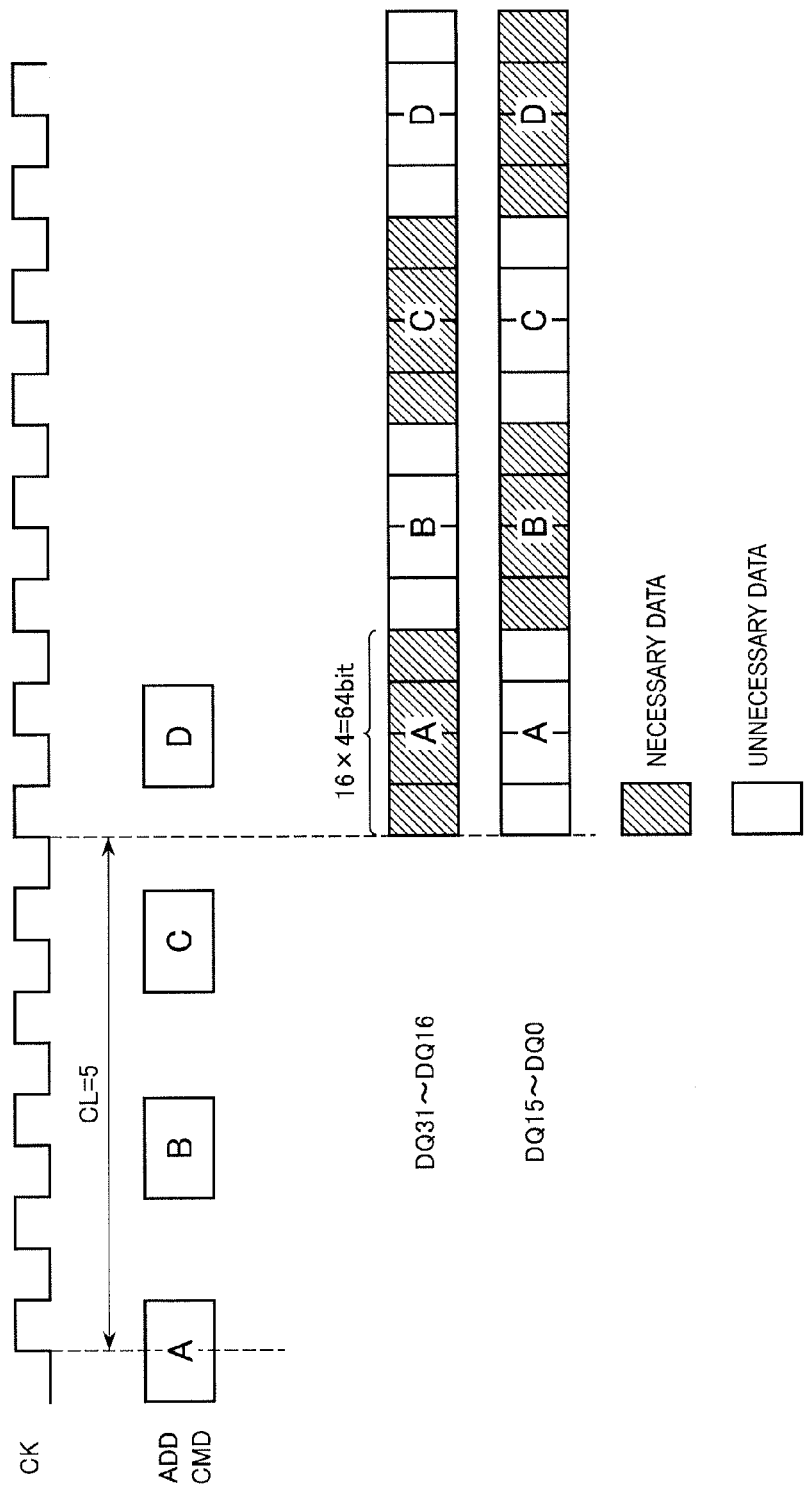
FIG. 9 is a timing chart for explaining a problem of a conventional semiconductor memory device.

When the chip selection signals CS1B and CS2B are alternately activated in this way, the memory circuit units 110A and 110B can be alternately continuously accessed. That is, when the chip selection signals CS1B and CS2B are alternately activated, a shortest input cycle tCCD of a column command becomes BL/4 (=1), and the column command READ can be issued at each one clock cycle. With this arrangement, as shown in FIG. 9, when one of 64-bit data output from DQ0 to DQ15 and 64-bit data output from DQ16 to DQ31 is necessary data and also when the other 64-bit data is unnecessary data, only the necessary data can be continuously taken out. Accordingly, utilization efficiency of a data bus can be improved.

Figure 5:
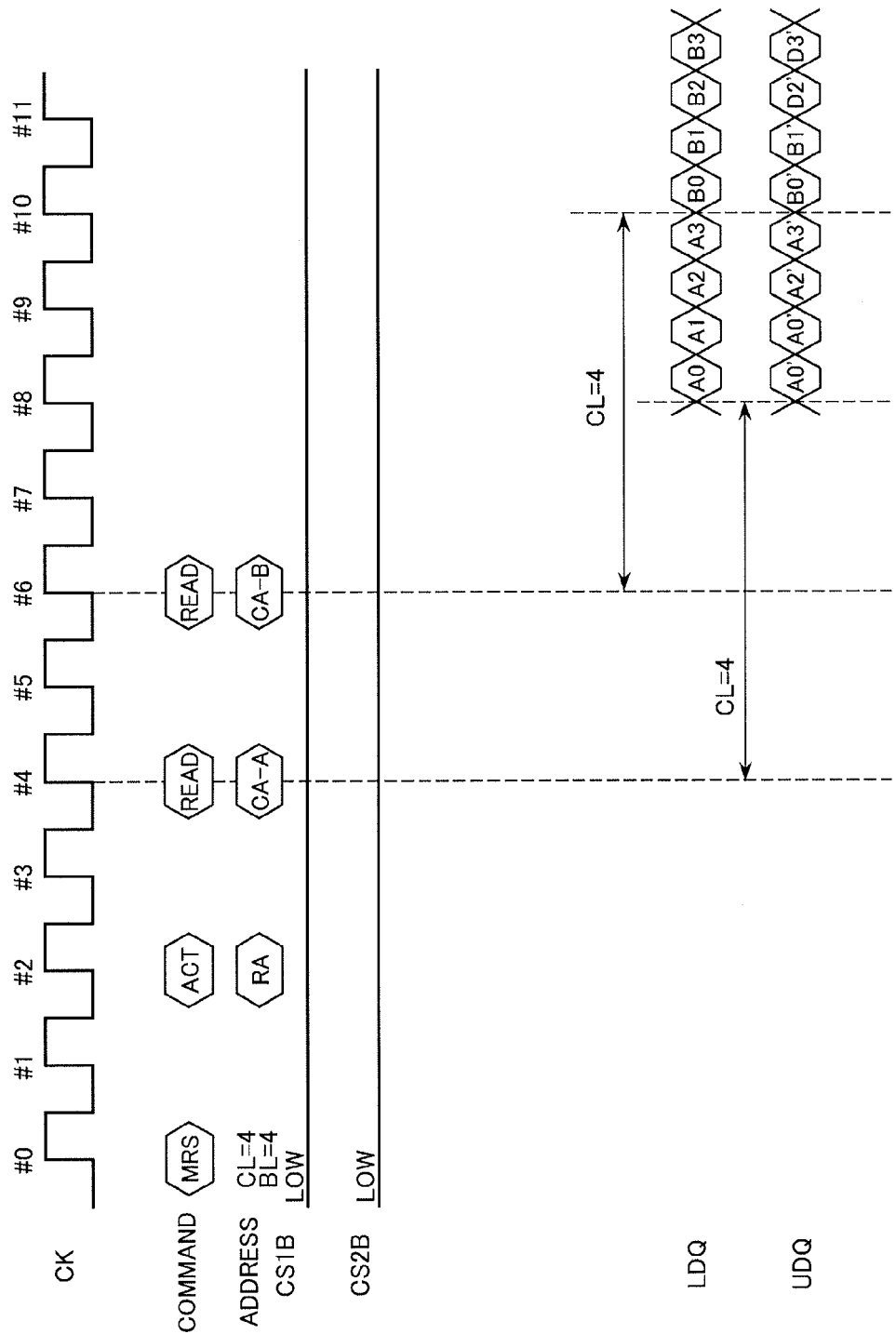
FIG. 5 is a timing diagram for explaining a read operation of the semiconductor memory device 100 according to the first embodiment, and shows a case of simultaneously accessing the memory circuit units 110A and 110B.

FIG. 5 is a timing diagram for explaining a read operation of the semiconductor memory device 100 according to the first embodiment, and shows a case of simultaneously accessing the memory circuit units 110A and 110B.

In the example shown in FIG. 5, the mode-register set command MRS is also issued synchronously with the active edge #0 of the external clock CK, thereby setting the burst length=4 (BL=4) and CAS latency=4 (CL=4) to the mode register 125. Next, the active command ACT and the row address RA are input synchronously with the active edge #2 of the external clock CK. During this period, both of the chip selection signals CS1B and CS2B are activated at a low level.

Therefore, the row address RA is latched by both of the memory circuit units 110A and 110B.

Next, the read command READ and the column address CA-A are input synchronously with the active edge #4 of the external clock CK in a state that both of the chip selection signals CS1B and CS2B are activated at a low level. Consequently, the read command READ and the column address CA-A are latched by both of the memory circuit units 110A and 110B, and the memory circuit units 110A and 110B simultaneously perform a read operation. Consequently, burst output is started from the active edge #8 when the CAS latency (CL=4) passes. This burst output is completed at the active edge #10 (A0 to A3, A0' to A3').

Similarly, the read command READ and the column address CA-B are input synchronously with the active edge #6 of the external clock CK in a state that both of the chip selection signals CS1B and CS2B are activated at a low level. Consequently, the memory circuit units 110A and 110B simultaneously perform a read operation, and start burst output from the active edge #10. This burst output is completed at an active edge #12 (B0 to B3, B0' to B3').

When both of the chip selection signals CS1B and CS2B are activated in this way, the shortest input cycle tCCD of a column command becomes BL/2 (=2), and the semiconductor memory device can perform the same operation as that of a general semiconductor memory device. Therefore, the semiconductor memory device can maintain compatibility with existing semiconductor memory devices.

While a read operation in the first embodiment has been explained above, the above explanations are also applied to a write operation. That is, the memory circuit unit 110A can perform a write operation via the data input/output terminal group LDQ regardless of an operation of the memory circuit unit 110B, and the memory circuit unit 110B can perform a write operation via the data input/output terminal group UDQ regardless of an operation of the memory circuit unit 110A.

Figure 6:
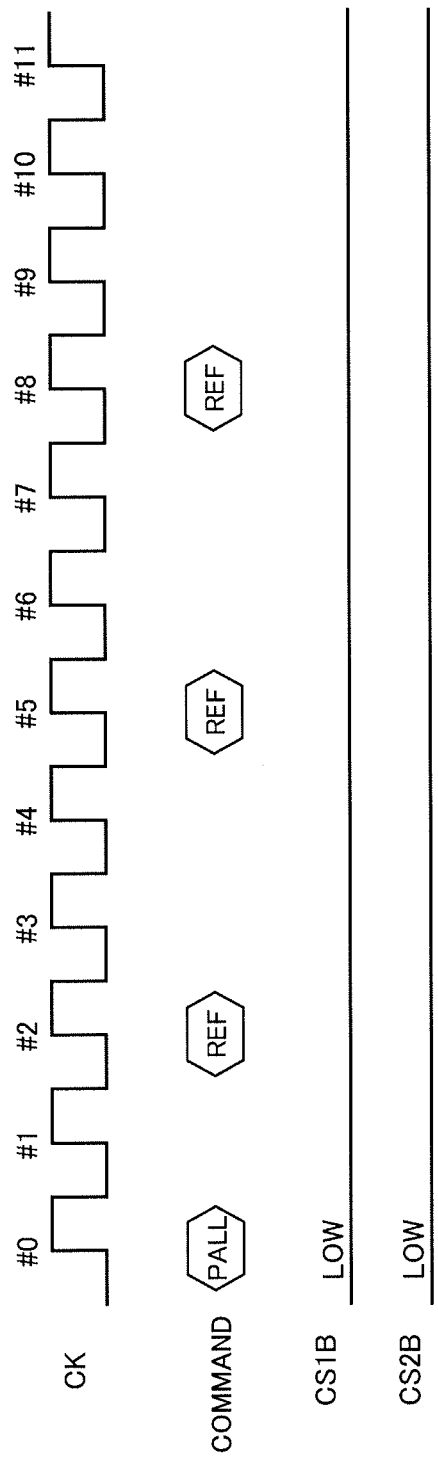
FIG. 6 is a timing diagram for explaining a refresh operation of the semiconductor memory device 100 according to the first embodiment.

FIG. 6 is a timing diagram for explaining a refresh operation of the semiconductor memory device 100 according to the first embodiment.

In an example shown in FIG. 6, a total-bank precharge command PALL is issued synchronously with the active edge #0 of the external clock CK, and further a refresh command REF is issued synchronously with the active edges #2, #5, and #8. During this period, both of the chip selection signals CS1B and CS2B are activated at a low level. Therefore, the refresh command REF is valid in both of the memory circuit units 110A and 110B, and a refresh operation is performed simultaneously in the memory circuit units 110A and 110B. In this way, the semiconductor memory device 100 according to the first embodiment can perform a refresh operation similar to that of a general DRAM.

A second embodiment of the present invention is explained next.

Figure 7:
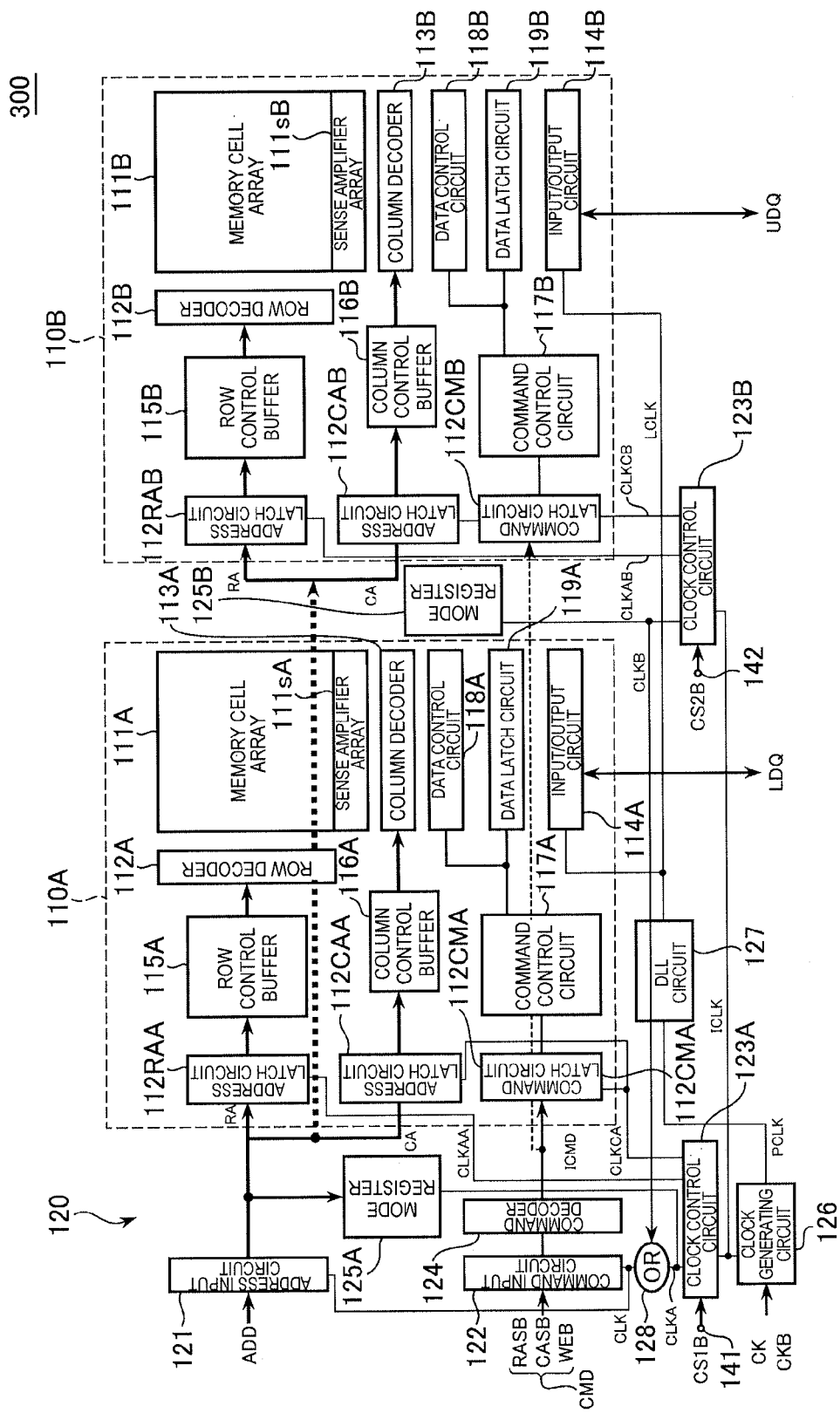
FIG. 7 is a block diagram showing a configuration of a semiconductor memory device 300 according to the second embodiment.

FIG. 7 is a block diagram showing a configuration of a semiconductor memory device 300 according to the second embodiment.

The semiconductor memory device 300 according to the second embodiment is different from the semiconductor memory device 100 in that two mode registers 125 are provided. Other features of the semiconductor memory device 300 are identical to those of the semiconductor memory device 100 described above, therefore like reference characters are denoted to like elements and redundant explanations thereof will be omitted.

Mode registers 125A and 125B included in the semiconductor memory device 300 according to the second embodiment are circuits to set operation modes of the memory circuit units 110A and 110B, respectively. That is, in the second embodiment, an operation mode of the memory circuit unit 110A and an operation mode of the memory circuit unit 110B can be set separately.

Figure 8:
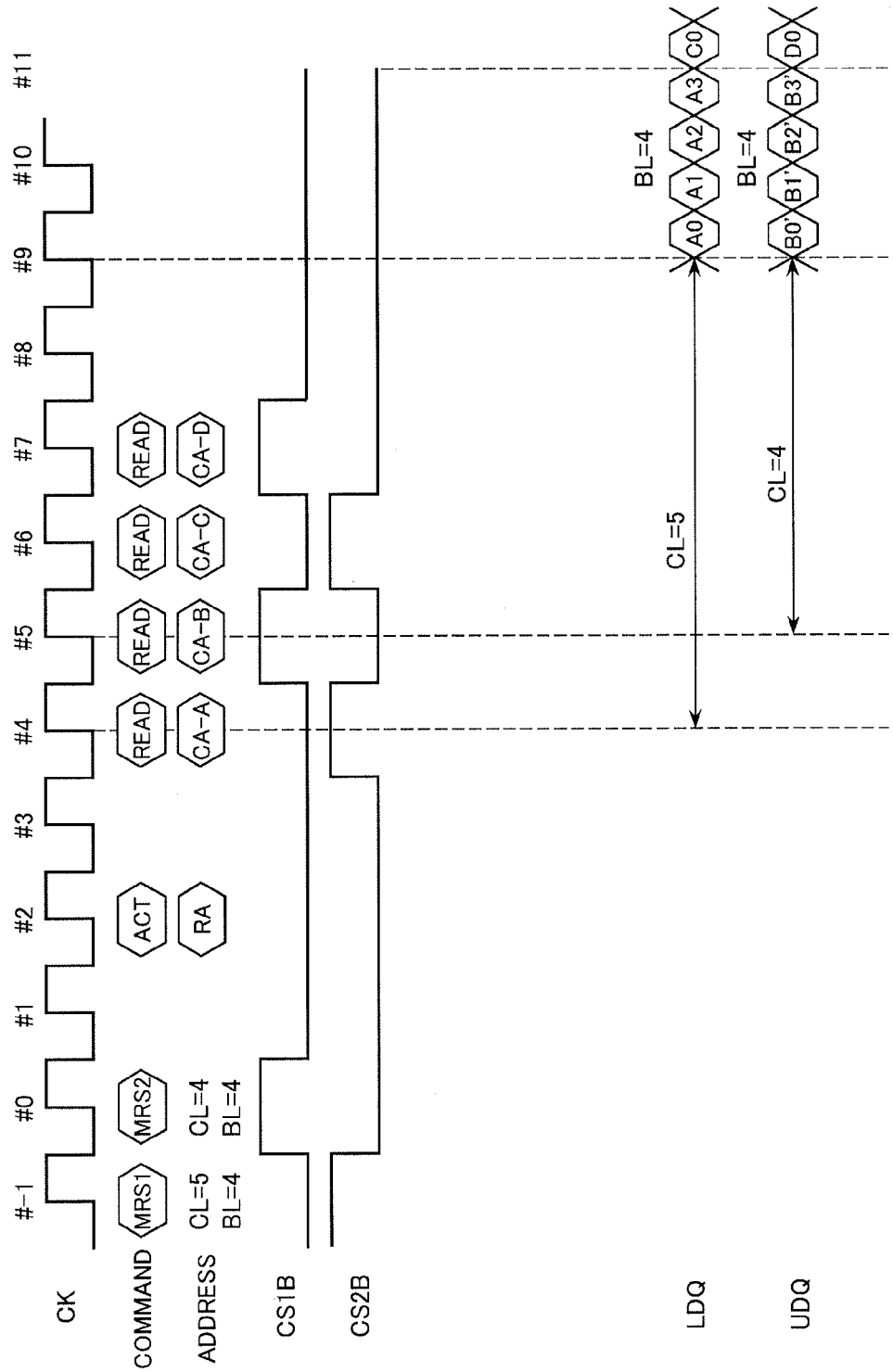
FIG. 8 is a timing diagram for explaining a read operation of the semiconductor memory device 300 according to the second embodiment, and shows a case of alternately accessing the memory circuit units 110A and 110B.

FIG. 8 is a timing diagram for explaining a read operation of the semiconductor memory device 300 according to the second embodiment, and shows a case of alternately accessing the memory circuit units 110A and 110B.

In an example shown in FIG. 8, the mode-register set command MRS is issued synchronously with an active edge #-1 of the external clock CK in a state that the chip selection signal CS1B is activated, thereby setting the burst length=4 (BL=4) and CAS latency=5 (CL=5) to the mode register 125A. Further, the mode-register set command MRS is issued synchronously with the active edge #0 of the external clock CK in a state that the chip selection signal CS2B is activated, thereby setting the burst length=4 (BL=4) and CAS latency=4 (CL=4) to the mode register 125B. In this way, mutually different CAS latencies are set to the mode registers 125A and 125B.

Thereafter, a read operation is similar to the read operation shown in FIG. 4. The active command ACT and the row address RA are input synchronously with the active edge #2 of the external clock CK, and thereafter, the read command READ is issued at each one clock cycle (=BL/4) while alternately activating the chip selection signals CS1B and CS2B.

As a result, the read command READ issued at the active edge #4 becomes valid in the memory circuit unit 110A, and starts burst output from the active edge #9 when the CAS latency (CL=5) passes. On the other hand, the read command READ issued at the active edge #5 becomes valid in the memory circuit unit 110B, and starts burst output from the active edge #9 when the CAS latency (CL=4) passes. That is, burst output can be simultaneously performed from the data input/output terminal groups LDQ and UDQ.

As described above, in the semiconductor memory device 300 according to the second embodiment, because the operation mode of the memory circuit unit 110A and the operation mode of the memory circuit unit 110B can be set separately, read data can be output simultaneously while alternately issuing mutually different read commands to the memory circuit units 110A and 110B. Accordingly, the controller can easily handle the read data.

It is apparent that the present invention is not limited to the above embodiments, but may be modified and changed without departing from the scope and spirit of the invention.

For example, in the above embodiments, although inside of each of the semiconductor memory devices 100 and 300 is divided into the two memory circuit units 110A and 110B, the number of division is not limited to two, and the inside can be divided into three or more memory circuit units.

In the above embodiments, although the command decoder 124 is provided in the common circuit 120, either a part or the whole of the command decoder 124 can be also provided in the memory circuit units 110A and 110B. Therefore, a command latched by the command latch circuits 112CMA and 112CMB can be a decoded command or an undecoded command.

In the above embodiments, although the chip selection signals CS1B and CS2B are external signals, it is not essential that the chip selection signal itself is an external signal. For example, an internal signal obtained by decoding a binary signal constituted by plural bits can be used as a chip selection signal.

Figure 10:
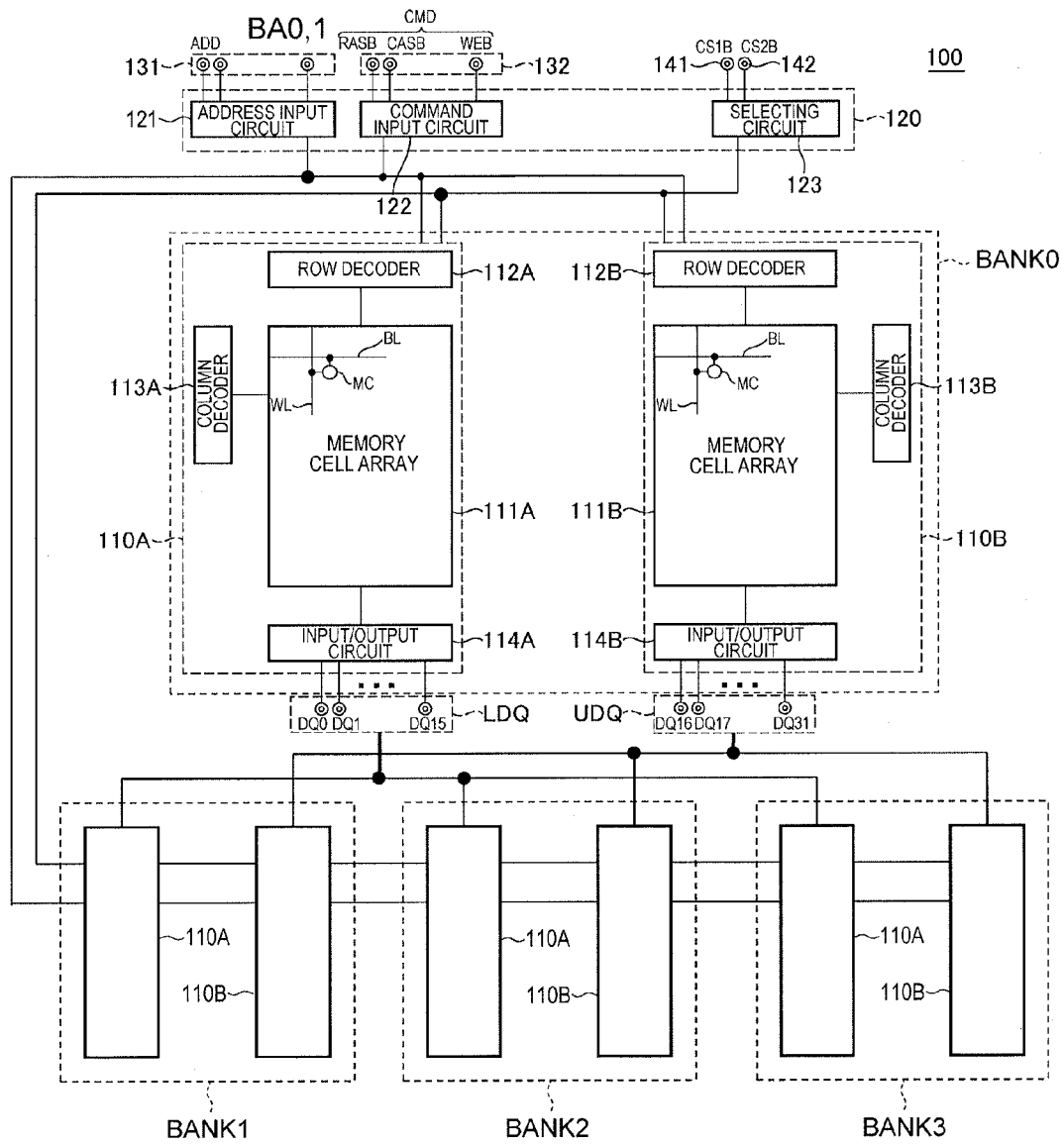
FIG. 10 is a block diagram of a semiconductor memory device having plural banks.

Furthermore, the present invention can be also applied to a semiconductor memory device having a memory cell array divided into plural banks. FIG. 10 is a block diagram of a semiconductor memory device having plural banks. The semiconductor memory device shown in FIG. 10 includes four banks BANK0 to BANK3, and each of the banks includes the memory circuit units 110A and 110B. In this manner, a semiconductor memory device having plural banks can have plural memory circuit units in each bank.

In addition, while not specifically claimed in the claim section, the applicant reserves the right to include in the claim section of the application at any appropriate time the following devices:

A1. A semiconductor device comprising:
a memory cell array including a plurality of memory cells;
a plurality of data input/output terminals; and
a plurality of address terminals, wherein
during a period when a group of data corresponding to first address information supplied from the address terminals is transmitted or received by using data input/output terminals of which number is smaller than number of the data input/output terminals, a group of data corresponding to second address information supplied from the address terminals is transmitted or received by using rest of the data input/output terminals.

A2. A semiconductor device formed on a single semiconductor substrate, the semiconductor memory device comprising:
an address/command terminal group that receives address information and command information;
first and second memory circuit units;
first and second data input/output terminal groups provided corresponding to the first and second memory circuit units, respectively;
a selected-information input terminal group; and
a control circuit connected to the address/command terminal group and the selected-information input terminal group, wherein
the control circuit performs a first data transfer operation between the first memory circuit unit and the first data input/output terminal group based on the address information and the command information when information from the selected-information input terminal group selects the first memory circuit unit,
the control circuit performs a second data transfer operation between the second memory circuit unit and the second data input/output terminal group based on the address information and the command information when the information from the selected-information input terminal group selects the second memory circuit unit, and
the control circuit performs the first and second data transfer operations when the information from the selected-information input terminal group selects both of the first and second memory circuit units.

What is claimed is:

1. A system comprising:
a controller that includes:
first and second selection-signal terminals supplying first and second selection-signals, respectively;
a plurality of first data terminals; and
a plurality of second data terminals; and
a memory chip that includes:
a semiconductor substrate;
third and fourth selection-signal terminals provided on the semiconductor substrate and being electrically coupled to the first and second selection-signal terminals of the controller, respectively;
a plurality of third data terminals provided on the semiconductor substrate and being electrically coupled to the first data terminals of the controller, respectively; and
a plurality of fourth data terminals provided on the semiconductor substrate and being electrically coupled to the second data terminals of the controller, respectively;
the first and third data terminals communicating first data in response to the first selection-signal, the second and fourth data terminals communicating second data in response to the second selection-signal.

2. The system as claimed in claim 1, wherein the memory chip further includes first and second mode registers each provided on the semiconductor substrate, the first mode register storing first information in response to the first selection-signal, the second mode register storing second information in response to the second selection-signal.

3. The system as claimed in claim 2, wherein the memory chip further includes first and second circuits each provided on the semiconductor substrate, the first and second circuits being substantially same in configuration as each other, the first and second circuits performing an operation in response to the information of the first and second mode registers, respectively.

4. The system as claimed in claim 3, wherein the first and second circuits memorize the first and second data, respectively.

5. The system as claimed in claim 4, wherein the first and second circuits respectively output the first and second data to the third and fourth data terminals substantially simultaneously with each other.

6. The system as claimed in claim 3, wherein the first and second circuits performing an operation in response to the information of the first and second mode registers, respectively.

7. The system as claimed in claim 6, wherein the operation that includes at least one of a read operation of a corresponding one of the first and second circuits and a write operation of a corresponding one of the first and second circuits.

8. The system as claimed in claim 7, wherein the read operation includes a refresh operation.

9. A system comprising:
a controller that includes first and second selection-signal terminals supplying first and second selection-signals, respectively; and
a memory chip that includes:
a semiconductor substrate;
third and fourth selection-signal terminals provided on the semiconductor substrate and being electrically coupled to the first and second selection-signal terminals of the controller to receive the first and second selection-signals, respectively;
first and second mode registers each provided on the semiconductor substrate, the first mode register storing first information in response to the first selection-signal, the second mode register storing second information in response to the second selection-signal; and
first and second circuits each provided on the semiconductor substrate and each performing an operation, the operation of the first circuit being controlled by the first information, the operation of the second circuit being controlled by the second information.

10. The system as claimed in claim 9, wherein
the controller further includes:
a plurality of first data terminals and a plurality of second data terminals;

the memory chip further including:
- a plurality of third data terminals provided on the semiconductor substrate and being electrically coupled to the first data terminals of the controller, respectively; and
- a plurality of fourth data terminals provided on the semiconductor substrate and being electrically coupled to the second data terminals of the controller, respectively;
- the first and third data terminals communicating first data in response to the first selection-signal, the second and fourth data terminals communicating second data in response to the second selection-signal.

11. The system as claimed in claim 10, wherein the first and second circuits are substantially same in configuration as each other.

12. The system as claimed in claim 11, wherein the first and second circuits memorize the first and second data, respectively.

13. The system as claimed in claim 12, wherein the first and second circuits respectively output the first and second data to the third and fourth data terminals substantially simultaneously with each other.

14. The system as claimed in claim 9, wherein the operation includes at least one of a read operation of a corresponding one of the first and second circuits and a write operation of a corresponding one of the first and second circuits.

15. The system as claimed in claim 14, wherein the read operation includes a refresh operation.

16. A system comprising:
- a controller that includes first and second selection-signal terminals supplying first and second selection-signals, respectively; and
- a memory chip that includes:
  - a semiconductor substrate;
  - third and fourth selection-signal terminals provided on the semiconductor substrate and being electrically coupled to the first and second selection-signal terminals of the controller to receive the first and second selection-signals, respectively;
  - first and second command circuits provided on the semiconductor substrate, the first command circuit latching a first command signal in response to the first selection-signal and the second command circuit latching a second command signal in response to the second selection-signal; and
  - first and second memory circuits provided on the semiconductor substrate, the first memory circuit performing an operation in response to the first command latched in the first command circuit and the second memory circuit performing an operation in response to the second command latched in the second command circuit.

17. The system as claimed in claim 16, wherein the memory chip further includes first and second mode registers each provided on the semiconductor substrate, the first mode register storing first information in response to the first selection-signal, the second mode register storing second information in response to the second selection-signal.

18. The system as claimed in claim 17, wherein the memory chip further includes first and second circuits each provided on the semiconductor substrate, the first and second circuits being substantially same in configuration as each other, the first and second circuits performing an operation in response to the information of the first and second mode registers, respectively.

19. The system as claimed in claim 17, wherein
the controller further includes:
- a plurality of first data terminals; and
- a plurality of second data terminals; and
the memory chip further including:
- a plurality of third data terminals provided on the semiconductor substrate and being electrically coupled to the first data terminals of the controller, respectively; and
- a plurality of fourth data terminals provided on the semiconductor substrate and being electrically coupled to the second data terminals of the controller, respectively;
- the first and third data terminals communicating first data in response to the first selection-signal, the second and fourth data terminals communicating second data in response to the second selection-signal.

20. The system as claimed in claim 19, wherein the first and second circuits respectively memorize the first and second data, and respectively output the first and second data to the third and fourth data terminals substantially simultaneously with each other.

* * * * *